(12) United States Patent
Hashimoto et al.

(10) Patent No.: US 11,506,690 B2
(45) Date of Patent: Nov. 22, 2022

(54) COIL WIRE, CURRENT SENSOR COMPONENT, AND CURRENT SENSOR

(71) Applicant: SUMIDA CORPORATION, Tokyo (JP)

(72) Inventors: Masateru Hashimoto, Ueda (JP); Masaki Saito, Ueda (JP)

(73) Assignee: SUMIDA CORPORATION

( * ) Notice: Subject to any disclaimer, the term of this patent is extended or adjusted under 35 U.S.C. 154(b) by 528 days.

(21) Appl. No.: 16/569,743

(22) Filed: Sep. 13, 2019

(65) Prior Publication Data

US 2020/0132730 A1 Apr. 30, 2020

(30) Foreign Application Priority Data

Oct. 26, 2018 (JP) .............................. JP2018-202090

(51) Int. Cl.
*G01R 15/18* (2006.01)
*G01R 19/00* (2006.01)
(Continued)

(52) U.S. Cl.
CPC ....... *G01R 15/183* (2013.01); *G01R 19/0092* (2013.01); *H01F 27/25* (2013.01);
(Continued)

(58) Field of Classification Search
CPC .. H01L 21/00; G01R 1/00; H02H 1/00; H01F 1/00
See application file for complete search history.

(56) References Cited

U.S. PATENT DOCUMENTS

| 3,434,052 A | 3/1969 | Fechant |
| 2005/0242805 A1* | 11/2005 | Honkura ............ G01R 33/0206 324/249 |

(Continued)

FOREIGN PATENT DOCUMENTS

| JP | S63-061961 A | 3/1988 |
| JP | H05-203679 A | 8/1993 |

(Continued)

OTHER PUBLICATIONS

Murgatroyd P. N. et al., "Making Rogowski Coils"; Measurement Science and Technology; IOP, Bristol, GB; Issued on Dec. 1, 1991; vol. 12, No. 12; pp. 1218 to 1219 (total 2 pages).

(Continued)

*Primary Examiner* — Jermele M Hollington
*Assistant Examiner* — Temilade S Rhodes-Vivour
(74) *Attorney, Agent, or Firm* — Harness, Dickey & Pierce, P.L.C.

(57) ABSTRACT

A coil wire includes a core wire and a winding wire. The winding wire is wound around a circumference of the core wire so as to form a plurality of spirals. The coil wire satisfies one of: (i) an outer surface of the core wire is exposed, and a distance between the outer surface of the core wire and an inner circumferential surface of part of the winding wire is smaller than a thickness of a first insulating film coated on the winding wire; or (ii) the outer surface of the core wire is coated by a second insulating film, and a distance between an outer surface of the second insulating film and the inner circumferential surface of part of the winding wire is smaller than a thickness of a thicker one of the first insulating film and the second insulating film.

14 Claims, 8 Drawing Sheets

(51) Int. Cl.
*H01F 27/25* (2006.01)
*H01F 27/28* (2006.01)
*H01F 27/29* (2006.01)
*H01F 27/32* (2006.01)

(52) U.S. Cl.
CPC ......... *H01F 27/2823* (2013.01); *H01F 27/29* (2013.01); *H01F 27/325* (2013.01)

(56) References Cited

U.S. PATENT DOCUMENTS

| | | | |
|---|---|---|---|
| 2007/0210787 A1 | 9/2007 | Ebenezer et al. | |
| 2013/0038323 A1* | 2/2013 | Honkura | G01R 33/18 324/244 |
| 2015/0143923 A1* | 5/2015 | Saito | H01L 41/125 73/862.69 |
| 2015/0145631 A1* | 5/2015 | Yoshimori | H01F 5/00 242/531 |
| 2015/0364977 A1* | 12/2015 | Hattori | H02K 3/38 29/596 |
| 2017/0356935 A1* | 12/2017 | Hurwitz | G01R 19/12 |

FOREIGN PATENT DOCUMENTS

| | | |
|---|---|---|
| JP | 2012-088224 A | 5/2012 |
| JP | 2018-054490 A | 4/2018 |

OTHER PUBLICATIONS

Partial European Search Report issued for the corresponding European Patent Application No. 19203169.8; dated Mar. 3, 2020 (total 11 pages).

Summons to attend oral proceedings pursuant to Rule 115(1) EPC issued for the corresponding European Patent Application No. 19203169.8; dated Aug. 19, 2022 (total 9 pages).

* cited by examiner

COIL WIRE, CURRENT SENSOR COMPONENT, AND CURRENT SENSOR

CROSS-REFERENCE TO RELATED APPLICATIONS

This application claims priority to Japanese Patent Application No. 2018-202090 filed Oct. 26, 2018, which is hereby expressly incorporated by reference herein in its entirety.

BACKGROUND

1. Technical Field

The present invention relates to a coil wire, a current sensor component, and a current sensor.

2. Related Art

As shown in Japanese Patent Publication Number H05-203679, a transformer type sensor in which primary and secondary winding wires are wound around a toroidal core is often utilized for a conventional current sensor. With respect to the sensor explained above, since an electric current that is a measurement target flows in the primary winding wire, changes in magnetic flux are caused in the toroidal core. As a result, an electric current is induced in the secondary winding wire. Therefore, the electric current flowing in the primary winding wire can be measured by detecting the electric current that flows in the secondary winding wire.

Further, as shown in Japanese Patent Publication Number S63-061961, with respect to another type of a current sensor, a magnetic core is provided. The magnetic substance core becomes a magnetic path of a circulating magnetic flux that is generated by a detected electric current. Further, a hall element is provided in a gap of the magnetic substance core. A level of an electric signal that is output from the hall element is changed according to strength and a direction of the circulating magnetic flux being generated by the detected electric current. As a result, the electric signal that is output from the hall element is amplified by an amplifier circuit so as to be output as an electric current value of the detected electric current.

However, a magnetic core needs to be utilized in any of the configurations of Japanese Patent Publication Number H05-203679 and Japanese Patent Publication Number S63-061961. Therefore, there are disadvantages that a large number of sensor components are required and a size and a weight of the sensor become large. In addition, there is a problem that an installation of the sensor is very difficult because a magnetic core is utilized.

SUMMARY

The present invention attempts to solve the above problems. An object of the present invention is to provide a coil wire, a current sensor component, and a current sensor in which a size and a weight thereof are small and it is convenient to be installed.

In order to achieve the above object, a coil wire according to one aspect of the present invention includes: a core wire having flexibility and conductivity; and a winding wire configured with a conductive wire and a first insulating film that coats the conductive wire. One end of the core wire is electrically connected to one end of the winding wire. The winding wire is wound around a circumference of the core wire so as to form a plurality of spirals. The core wire is a common central axis of the plurality of spirals. The coil wire satisfies one of conditions (i) or (ii): (i) an outer surface of the core wire is exposed, and a shortest distance between the outer surface of the core wire and an inner circumferential surface of at least part of the plurality of spirals of the winding wire is smaller than a thickness of the first insulating film; or (ii) the outer surface of the core wire is coated by a second insulating film, and a shortest distance between an outer surface of the second insulating film and the inner circumferential surface of at least part of the plurality of spirals of the winding wire is smaller than a thickness of a thicker one of the first insulating film and the second insulating film.

A current sensor component according to another aspect of the present invention includes: a bobbin having a cylindrical member; the coil wire described above and the coil wire is wound around a center axis of the cylindrical member of the bobbin at several times; a first lead wire connected to one end of the core wire and one end of the winding wire; and a second lead wire connected to the other end of the core wire and the other end of the winding wire.

Further, the current sensor component according to another aspect of the present invention includes: a longitudinal conductor member having terminals at both ends; and the coil wire described above that is wound around the conductor member.

A current sensor according to another aspect of the present invention includes: the coil wire described above; and a detector connected between one end of the core wire and one end of the winding wire so as to detect an electric signal. The detector is configured to detect the electric signal corresponding to an electric current flowing through a coil wire spiral. The coil wire spiral is formed by spiraling or looping the coil wire.

Therefore, the present invention can provide a coil wire, a current sensor component, and a current sensor in which a small number of components thereof is required, a size and a weight are small and light, and an installation is convenient. Specifically, the current sensor is configured with the coil wire and/or the current sensor component explained above.

DESCRIPTION OF EXEMPLARY EMBODIMENTS

As discussed below, first and second embodiments according to the present invention are explained with reference to the drawings. In regards to the drawings, redundant explanations with respect to the same configurations are omitted but the same reference numerals are used for labeling. Further, because the drawings according to the first and second embodiments are for explaining, for instance, the configurations or the functions of the first and second embodiments, a size ratio, a thickness (or a diameter), a length, a width, and a height may not necessarily be shown precisely. Further, the first and second embodiments are not limited to the configurations shown in the drawings. Further, in this specification, the first and second embodiments are also collectively referred to as "present embodiment(s)."

Outline

Figure 1:
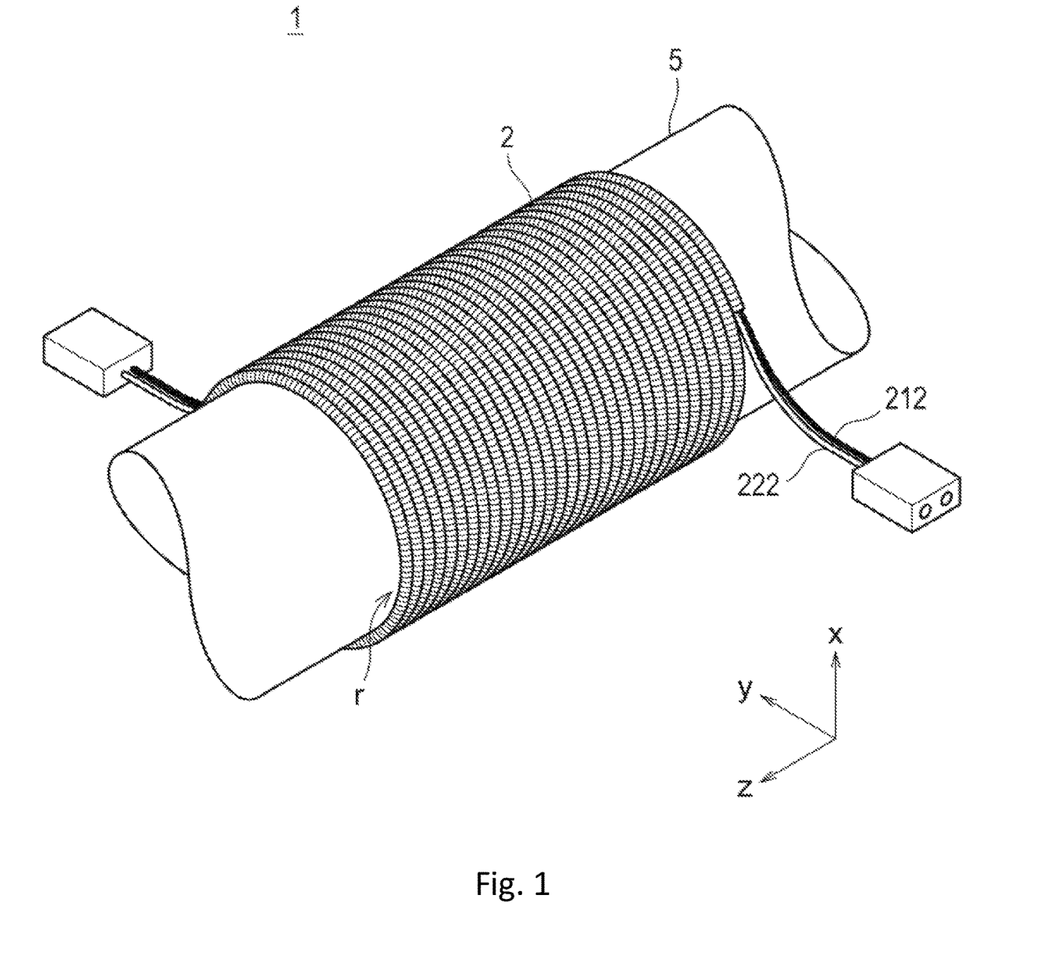
FIG. 1 is a schematic view for explaining a current sensor component according to first and second embodiments of the present invention.

FIG. 1 is a diagram that shows a current sensor component 1 in which a coil wire 2 is utilized according to the present embodiment of the present invention. The current sensor component 1 is one of parts that are utilized for a current sensor.

As explained below, the coil wire 2 is configured with a core wire and a winding wire. Specifically, the coil wire 2 is formed by spiraling or looping the winding wire around the core wire. The current sensor component 1 shown in FIG. 1 is configured with the coil wire 2 and a conductor member. Specifically, the coil wire 2 is wound around the longitudinal (elongated) conductor member 5. The conductor member 5 is configured with a wire that has an electrical conductivity and an insulating film being made of an insulating resin that coats the wire. In addition, because a surface of a winding wire 22 (for instance, FIG. 2) of the coil wire 2 is coated with a first insulating film 221 (for instance, FIGS. 4A and 4B), the coil wire 2 and the conductor member 5 are insulated from each other.

In the present embodiment, a cross section of the conductor member 5 is in a circular shape. However, the configuration is not limited to the present embodiment. The cross section of the conductor member 5 can also be, for instance, in a rectangular shape. With respect to the current sensor component 1 shown in FIG. 1, the conductor member 5 is a current flow path through which a current (measured current or measurement target current) to be measured flows when the current sensor component 1 configures a current sensor. The measured current flows into and flows out from the conductor member 5 via an electrode.

The coil wire 2 is wound around the conductor member 5 in a circumferential direction thereof while the coil wire 2 is shifted in a longitudinal direction of the conductor member 5 by approximately a thickness (diameter) of the coil wire 2. In the present embodiment, the winding method explained above is referred to as a spiral (helical) winding.

Figure 2:
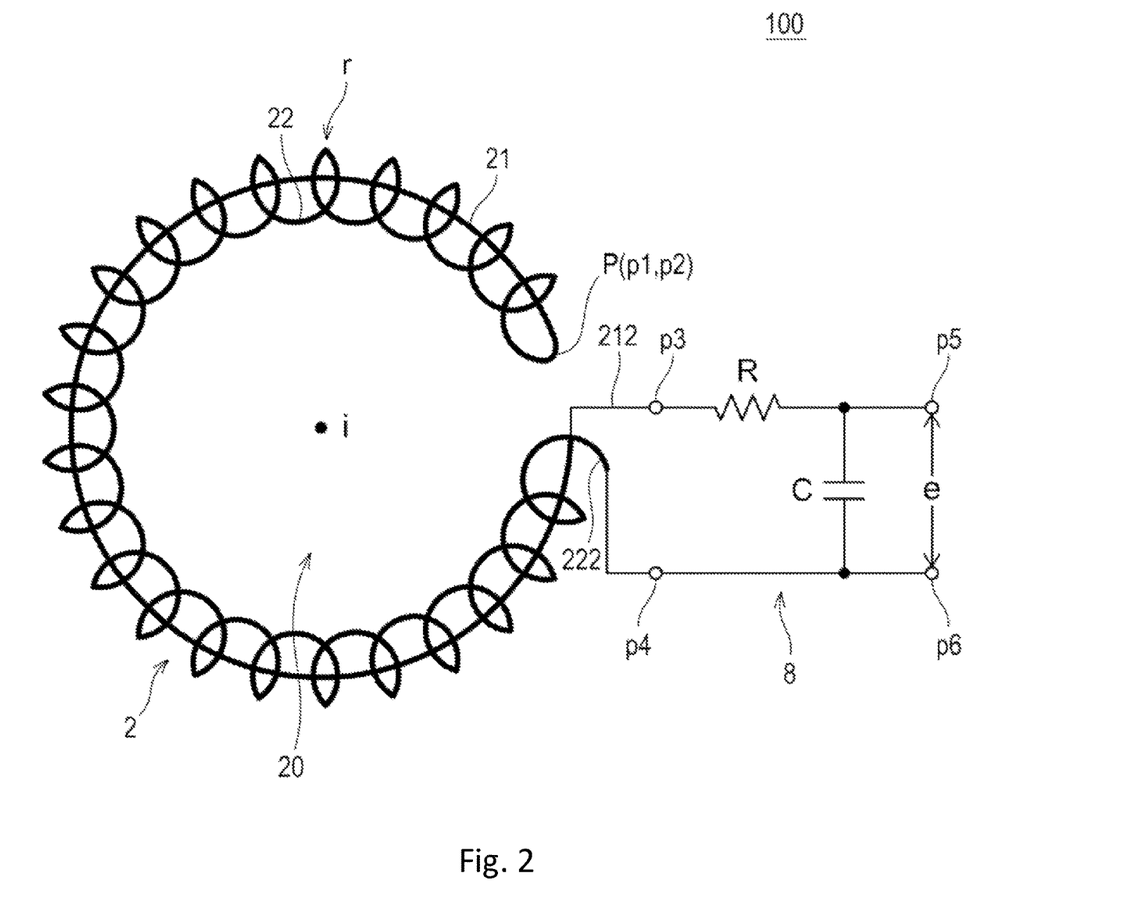
FIG. 2 is a schematic view for explaining a current sensor in which a coil wire shown in FIG. 1 is implemented according to the embodiments of the present invention.

In the present embodiment, the coil wire 2 is configured with a core wire 21 and a winding wire 22 (for instance, FIG. 2). A first lead (extension) wire 212 is physically and electrically connected to the core wire 21 and a second lead (extension) wire 222 is physically and electrically connected to the winding wire 22. The first extension wire 212 and the second extension wire 222 are lead wires (conducting wires) so that the core wire 21 and the winding wire 22 are electrically connected to an external circuit 8 shown in FIG. 2. Further, with respect to FIG. 2, it is simply represented that the coil wire 2, which is formed by the spiral winding, is wound around a winding axis by only one turn. However, in practice, the coil wire 2 is wound around the winding axis by two or more (stacked) layers in a radial direction without any space therebetween. The winding axis corresponds to a current flow direction of an electric current "i" that is a measured current and flows in a conductor member.

The coil wire 2, the current sensor component 1 in which the coil wire 2 is utilized, and a current sensor according to the present embodiment of the present invention will be explained below.

First Embodiment

Coil Wire

First of all, an electric characteristic of the coil wire 2 according to the first embodiment will be explained below.

FIG. 2 is a schematic view for explaining a current sensor 100 to which the coil wire 2 shown in FIG. 1 is applied. As shown in FIG. 2, the coil wire 2 is configured with the core wire 21 and the winding wire 22 that is spirally wound around the core wire 21. The core wire 21 and the winding wire 22 are different lead wires. However, one end "p1" and one end "p2" of the core wire 21 and the winding wire 22, respectively, are connected at a point "P." Further, the other end "p3" of the core wire 21 and the other end "p4" of the winding wire 22 correspond to ends of the first extension wire 212 and the second extension wire 222, respectively, that are connected to the external circuit 8, for instance, as shown in FIG. 2. Specifically, the other end "p3" is located at the different side of the core wire 21 with respect to one end "p1." The other end "p4" is located at the different side of the winding wire 22 with respect to one end "p2." The external circuit 8 is for observing an electric signal (for instance, a voltage) that is output from the core wire 21 and the winding wire 22. Further, this electric signal is observed as, for instance, a voltage "e" between terminals "p5" and "p6." The external circuit 8 explained above works as a detector that detects a current. The current sensor 100 detects and measures an electric current "I" that flows through the center of a coil wire spiral (circle, ring, or loop) 20. Specifically, the coil wire spiral 20 is configured by spiraling or looping the coil wire 2.

Figure 3A:
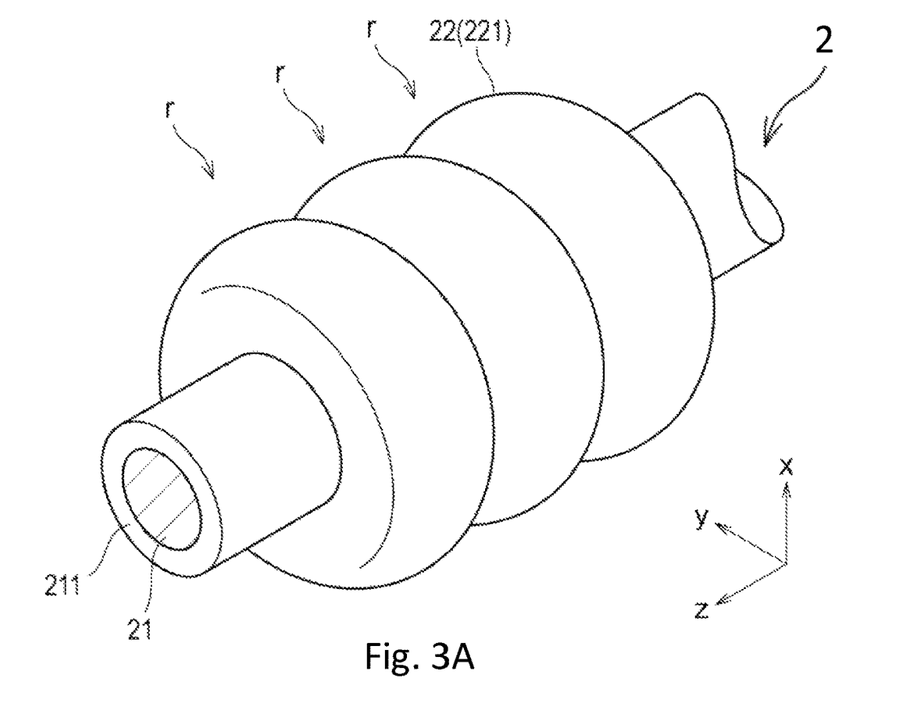
FIG. 3A is a schematic perspective view for showing a part of a coil wire according to the embodiments of the present invention.
Figure 3B:
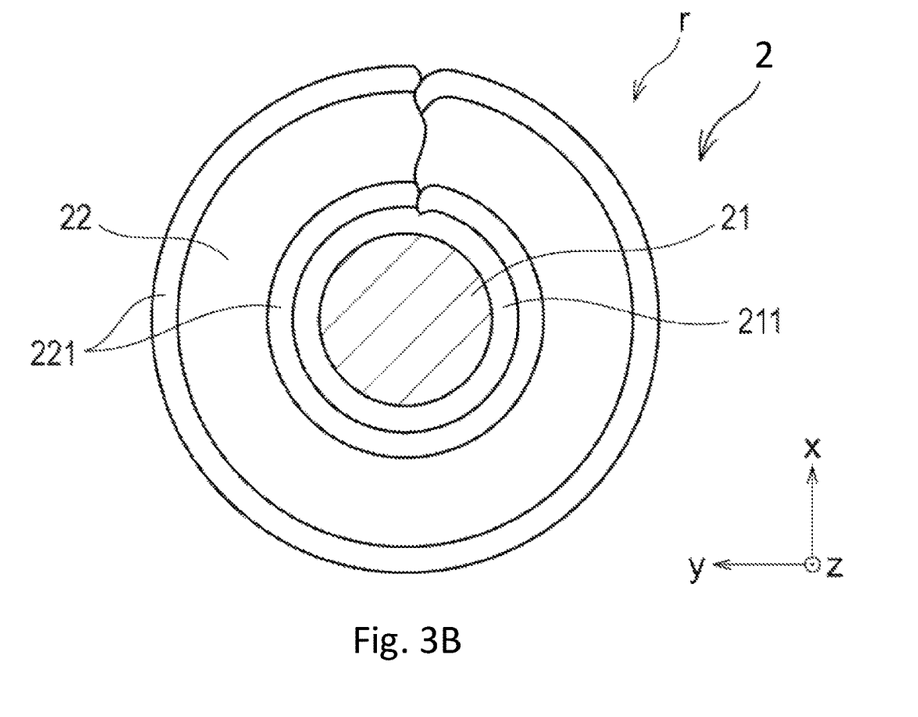
FIG. 3B is a cross-sectional view of the coil wire according to the embodiments of the present invention when the coil wire shown in FIG. 3A is cut.

FIG. 3A is a schematic perspective that shows a part of the coil wire 2 according to the embodiment of the present invention. FIG. 3B is a cross-sectional view (lateral profile)

when the coil wire 2 shown in FIG. 3A is cut in a direction orthogonal to an extending direction of the core wire 21. Further, in the present embodiment, the core wire 21 and the winding wire 22 that configure the current sensor component 1 have arbitrary thicknesses (diameters). With respect to the current sensor component 1 shown in FIG. 1, the winding wire 22 is sufficiently thinner (smaller) as compared with the core wire 21. However, the configurations shown in FIGS. 3A and 3B show the examples in which the thicknesses (diameters) of the core wire 21 and the winding wire 22 are substantially the same.

As shown in FIGS. 3A and 3B, in most cases, with respect to the coil wire 2 explained above, the core wire 21 is formed by coating a second insulating film 211 thereon. Further, the winding wire 22 is configured by coating a first insulating film 221 thereon. If a conductive wire 220 (FIG. 4) of the winding wire 22 being spirally wound does not come in contact with each other, and in addition, if the conductive wire 220 does not come in contact with the core wire 21, the coil wire 2 theoretically works as a wire for a current sensor.

Figure 4A:
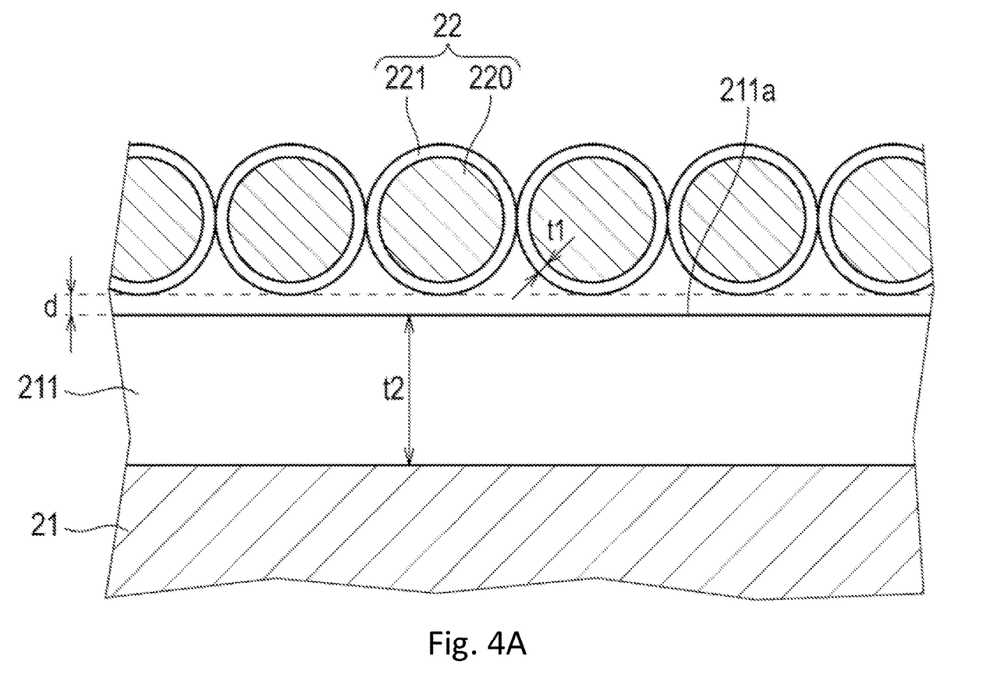
FIG. 4A is a diagram that shows a state in which a winding wire is wound around a core wire while the winding wire is spaced apart from the core wire by a predetermined distance "d" and at the same time, in which the core wire has a second insulating film according to the embodiments of the present invention.
Figure 4B:
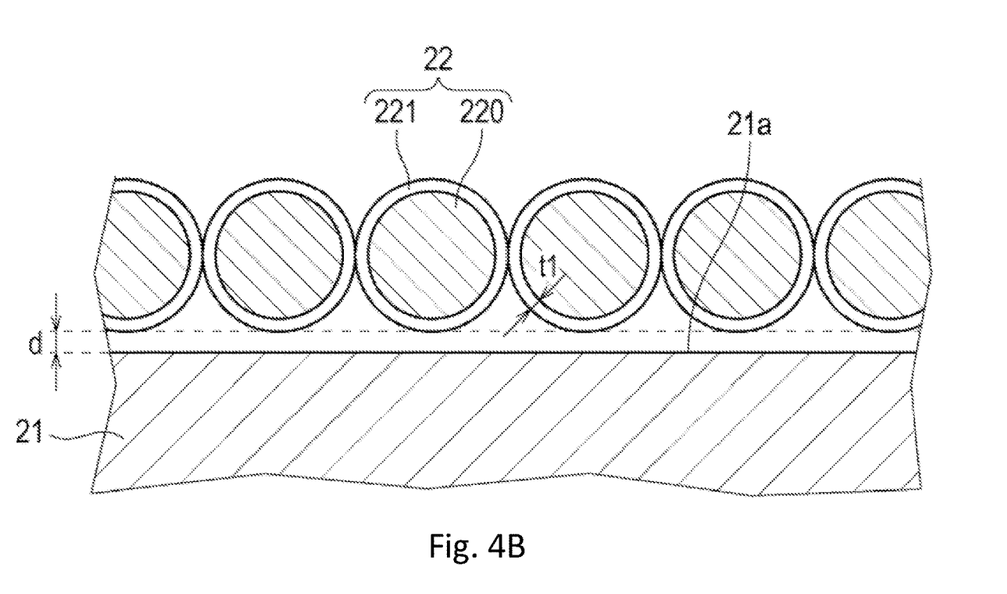
FIG. 4B is a diagram that shows a state in which the winding wire is wound around the core wire while the winding wire is spaced apart from the core wire by a predetermined distance "d" and at the same time, in which the core wire is exposed according to the embodiments of the present invention.
Figure 5:
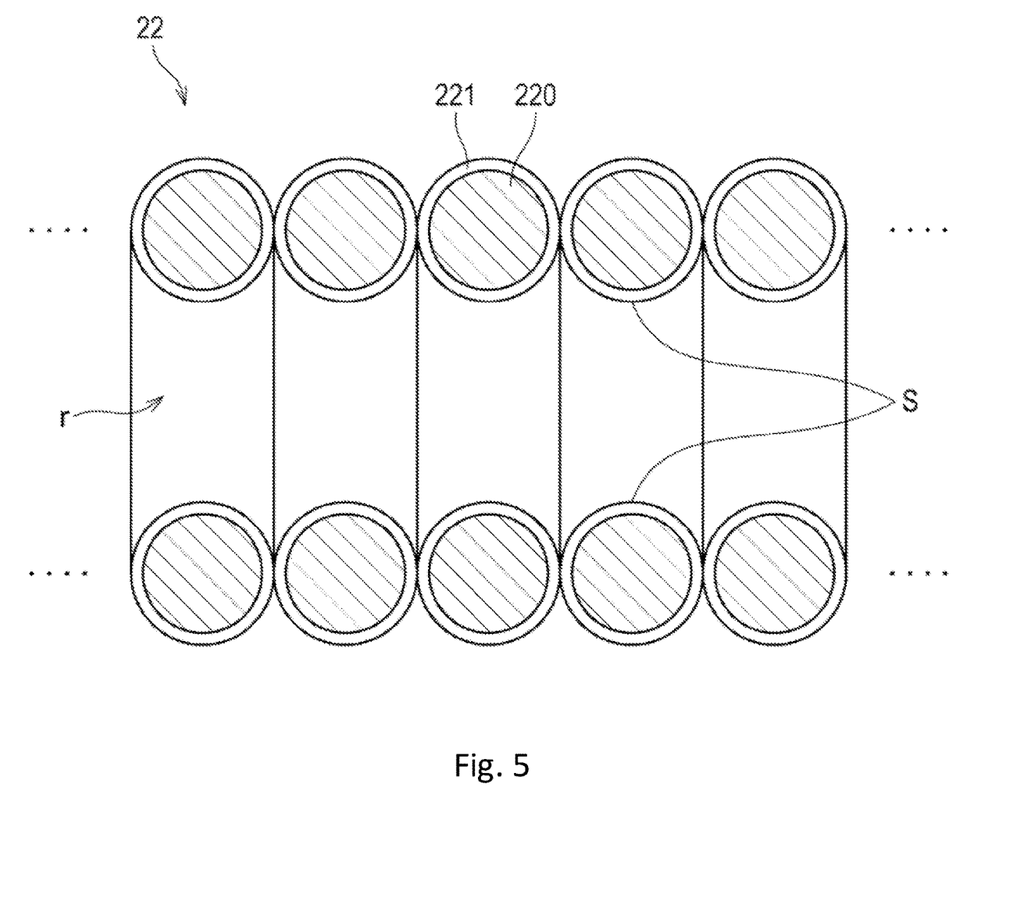
FIG. 5 is a diagram for explaining an inner circumferential surface of a winding wire according to the embodiments of the present invention.

Further, the coil wire 2 according to the first embodiment is configured as explained below. FIGS. 4A, 4B, and 5 are diagrams for explaining the shape or structure of the coil wire 2 shown in FIG. 1. FIGS. 4A and 4B are cross-sectional views when the coil wire 2 is cut along an X-Z plane and when viewed in the Y-direction in an X, Y, and Z coordinate system shown in FIGS. 3A and 3B. Both FIGS. 4A and 4B show a state in which the winding wire 22 is wound around the core wire 21 while the winding wire 22 is spaced apart from the core wire 21 by a predetermined distance "d." FIG. 4A shows an example in which the core wire 21 has (is coated by) the second insulating film 211. FIG. 4B shows an example in which the winding wire 22 is exposed without being coated by the second insulating film 211. FIG. 5 shows a loop (a spiral or spirals) "r" that is formed by the winding wire 22 by omitting the core wire 21 shown in FIGS. 4A and 4B. All of FIGS. 4A, 4B, and 5 are schematic views.

As shown in FIGS. 4A and 4B, the coil wire 2 according to the first embodiment has the core wire 21 and the winding wire 22. Specifically, the core wire 21 has flexibility and conductivity. The winding wire 22 is configured with the conductive wire 220 and a first insulating film 221 that is coated on the conductive wire 220. One end "p1" of the core wire 21 (FIG. 2) and one end "p2" of the winding wire 22 (FIG. 2) are electrically connected. At the same time, since the winding wire 22 is wound around the core wire 21, a plurality of spirals "r" (FIG. 3) in which the core wire 21 corresponds to a common central axis are formed.

With respect to the flexibility that is required for the core wire 21, it may be sufficient for the coil wire spiral 20 (FIG. 2) to be formed by deforming the core wire 21 into an annular shape. A diameter of the coil wire spiral 20 is determined depending on the uses and applications of the current sensor that is configured by using the coil wire 2. As the diameter of the coil wire spiral 20 that is formed by the core wire 21 decreases, the flexibility that is required for the core wire 21 increases. The winding wire 22 is configured with the conductive wire 220 and the first insulating film 221 that is formed so as to coat the conductive wire 220 (being coated and formed).

The core wire 21 and the conductive wire 220 can be, for instance, soft copper wires (annealed copper wires) (a cross section is in a circular shape) in which a diameter is 0.025 mm-3.2 mm. Further, the first insulating film 221 can be, for instance, an insulation film having a thickness of approximately 0.003 mm-0.035 mm of a varnish that is obtained by melting a high molecular compound (a polymeric compound). As the polymeric compound for the first insulating film 221, such as polyvinyl formal, polyurethane, polyamide imide, polyester, and nylon can be used.

Further, in the same manner as the first insulating film 221, the second insulating film 211 can also be an insulation film having a thickness of approximately 0.003 mm-0.035 mm of a varnish that is obtained by melting the high molecular compound (the polymeric compound). As the polymeric compound for the second insulating film 211, such as polyvinyl formal, polyurethane, polyamide imide, polyester, and nylon can also be used.

Further, with respect to the first embodiment, the cross sections of the core wire 21 and the conductive wire 220 are not limited to the circular shape. The cross sections of the core wire 21 and the conductive wire 220 may also be an elliptical (oval) shape, a rectangular shape, or a polygonal shape.

Further, the core wire 21 and the winding wire (and/or the conductive wire 220) can also be the same wire. In other words, the materials or sizes thereof can be all the same. Further, a part of the specifications or material properties of these wires may be different from each other. In addition, at least one of the core wire 21 and the winding wire 22 (and/or the conductive wire 220) can also be a single wire or a litz wire that is composed by twisting a plurality of wires together.

According to the first embodiment, the core wire 21 and the conductive wire 220 are insulated from each other. Thus, so long as they are insulated from each other, the core wire 21 may be coated with an insulating film (FIG. 4A) or may not be coated with an insulating film (FIG. 4B).

When the second insulating film 211 is formed on the surface of the core wire 21, as shown in FIG. 4A, the shortest distance "d" between the inner circumferential surface "S" (FIG. 5) of at least a part of the plurality of spirals "r" of the winding wire 22 and a surface 211a of the second insulating film 211 is smaller than the thicker one of a thickness t1 of the first insulating film 221 and a thickness t2 of the second insulating film 211. That is, with reference to the examples of the numerical values (in a range of approximately 0.003 mm to 0.035 mm) of the insulating films explained above, the shortest distance "d" can be any numerical value that is 0.003 mm or less or that is 0.035 mm or less. In the example shown in FIG. 4A, with respect to the thicknesses t1 and t2, it is clear that the thickness t2 (the second insulating film 211) is sufficiently larger than the thickness t1 (the first insulating film 221). Therefore, it is clear that the shortest distance "d" is smaller than the thickness t2 (the second insulating film 211—the thicker one) as shown in FIG. 4A.

As shown in FIG. 5, with respect to the circumferential surface of the winding wire 22, the inner circumferential surface "S" of the winding wire 22 faces toward the core wire 21. Therefore, the inner circumferential surface "S" is defined as the surface that can come in contact with the core wire 21 directly or come in contact with the core wire 21 indirectly via the second insulating film 211.

Further, "at least a part of the plurality of spirals 'r'" means (includes) a part or all of the plurality of spirals "r." In other words, it is excluded from such term (at least a part of the plurality of spirals "r") if with respect to all of the plurality of spirals "r," any and every distances between the inner circumferential surfaces "S" and the surface 211a are equal to or more than the shortest distance "d." Further, the shortest distance means the distance between the surface 211a and the point on the inner circumferential surface "S" that is the closest from the surface 211a among various points on the inner circumferential surface "S" of the plurality of spirals "r." Therefore, with respect to the configurations according to the first embodiment, a case is not excluded in which there is the point on the inner circumferential surface "S" in which the distance between such point and the surface 211a is equal to or more than the shortest distance "d."

However, with respect to the first embodiment, when the second insulating film 211 is formed on the surface of the core wire 21, it is preferred that an entirety of the inner circumferential surfaces "S" of at least a part of the plurality of spirals "r" of the winding wire 22 come in contact with the surface 211a of the second insulating film 211.

Further, with respect to the first embodiment, as shown in FIG. 4B, when the surface of the core wire 21 is exposed, the shortest distance "d" between the inner circumferential surface S of at least a part of the plurality of spirals "r" of the winding wire 22 and the surface 21a of the core wire 21 is smaller than the thickness t1 of the first insulating film 221. Note that although the illustration shown in FIG. 4B may not correspond to the above feature for the purpose of easy visible illustration, the first embodiment with respect to FIG. 4B is directed to a relationship of "d<t1." Here, the shortest distance means the distance between the surface 21a and the point on the inner circumferential surface "S" that is the closest from the surface 21a among various points on the inner circumferential surface "S" of the plurality of spirals "r." With respect to the first embodiment, when the surface 21a of the core wire 21 is exposed, it is preferred that an entirety of the inner circumferential surfaces "S" of at least a part of the plurality of spirals "r" of the winding wire 22 come in contact with the surface 21a of the core wire 21.

Figure 6A:
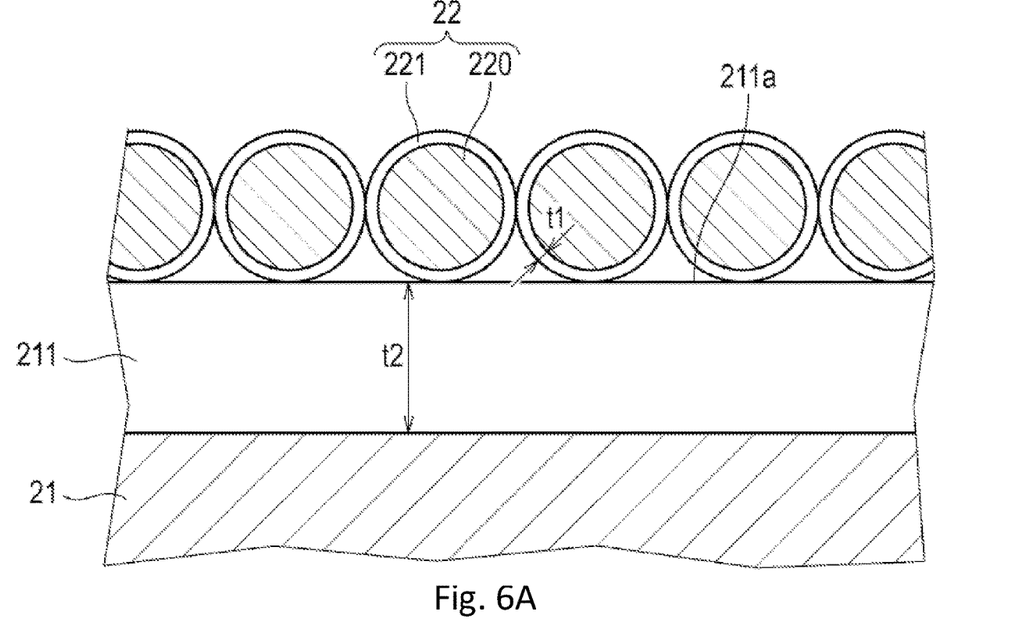
FIG. 6A is a diagram that shows a state in which a winding wire is wound around a core wire while the winding wire comes in contact with the core wire and at the same time, in which the core wire has a second insulating film according to the embodiments of the present invention.
Figure 6B:
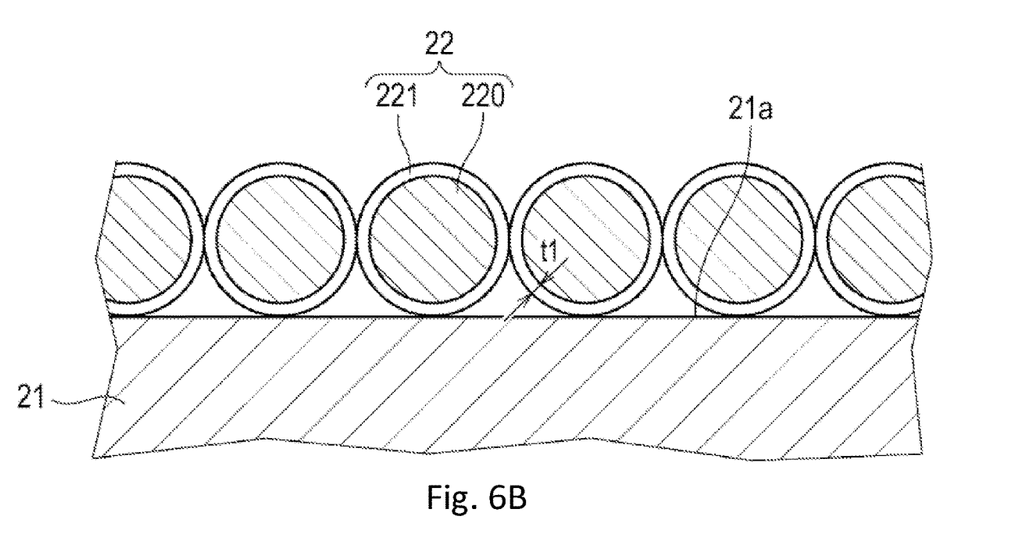
FIG. 6B is a diagram that shows a state in which the winding wire is wound around the core wire while the winding wire comes in contact with the core wire and at the same time, in which the core wire is exposed according to the embodiments of the present invention.

Further, with respect to the first embodiment, under the conditions and features explained above, the numerical value of the distance between the inner circumferential surface "S" and the surface 211a of the second insulating film 211 or the surface 21a of the core wire 21 can be "0 (zero)," i.e., the inner circumferential surface "S" and the surface 211a or surface 21a may come in contact with each other as shown in FIGS. 6A and 6B. Both of FIGS. 6A and 6B show a state in which the winding wire 22 is wound around the core wire 21 while the winding wire 22 comes in contact with the core wire 21. Specifically, FIG. 6A shows the example in which the core wire 21 has the second insulating film 211. FIG. 6B shows the example in which the winding wire 22 is exposed without coating of the second insulating film 211. In these examples in which the winding wire 22 comes in contact with the core wire 21, at least a part of the inner circumferential surface S of at least a part of the plurality of spirals "r" of the winding wire 22 comes in contact with the surface 211a of the second insulating film 211 or the surface 21a of the core wire 21.

As explained above, according to the first embodiment, since the winding wire 22 and the core wire 21 are directly adjacent to (next to) each other with a short distance therebetween or come in contact with each other, the space that the coil wire 2 occupies can be small. As a result, increasing of the resistance of the conductive wire 220 can be suppressed while an effect of the space-saving is enhanced. Further, the parasitic capacitance between the winding wire 22 and the core wire 21 can be adjusted by the film thicknesses of the first insulating film 221 and the second insulating film 211, and in addition by the dielectric constants (permittivities) of the first insulating film 221 and the second insulating film 211. The materials of the first insulating film 221 and the second insulating film 211 may be the same or may also be different. Further, the film thickness may also be adjusted according to the parasitic capacitance.

Further, the shortest distance "d" that is defined and explained above corresponds to the numerical value that is generated when the winding wire 22 is wound around the core wire 21 or the second insulating film 211 so as to come in contact with the core wire 21 or the second insulating film 211, and thereafter, is reverted by a slight spring back, for example. Further, when the shortest distance "d" is "0 (zero)," it can be considered that the winding wire 22 being wound maintains the state as it is by a heat treatment, for example. With respect to the coil wire 2 according to the first embodiment explained above, the dispersion of the distances between the winding wire 22 and the core wire 21 or the second insulating film 211 at the winding process of the winding wire 22 is small. As a result, when the coil wire 2 is utilized for a current sensor, it is efficient to decrease the product dispersion of the current sensors.

Further, the coil wire 2 according to the first embodiment can be formed so as to have an arbitrary length. Therefore, the coil wire 2 can be utilized by being wound around an arbitrary portion. As a result, the coil wire 2 can be utilized by being directly wound around the arbitrary portion of a measurement target in which a measured electric current (an electric current that is measured) flows.

Further, as shown in FIGS. 4A-6B, with respect to the coil wire 2 according to the first embodiment, the winding wire 22 (the conductive wire 220) that forms one of the plurality of spirals "r" comes in contact with the adjacent winding wire 22 (the conductive wire 220) that forms another of the plurality of spirals "r" at least a partial area (range) of the plurality of spirals "r." That is, according to the first embodiment, each of the plurality of spirals "r" is formed so as to adhere to an adjacent spiral "r" of the plurality of spirals "r." The term "adhere" (adherence) means a state in which, when a force is applied to the plurality of spirals "r" in the compressing direction of an array of the spirals "r," each of the plurality of spirals "r" comes in contact to another spiral and in which, when the force is released, each of the plurality of spirals "r" experiences a force in the separating direction that is configured to separate the plurality of spirals "r" from each other.

The phrase "at least a partial area (range)" means a partial area or an entire area in which the plurality of spirals "r" are arranged. That is, with respect to the first embodiment, a case is not excluded in which in a part of the plurality of spirals "r," adjacent two spirals "r" do not contact each other.

According to the configuration of the first embodiment explained above, the number of turns of the winding wire per unit length can be increased while the length of the conductive wire 220 is minimized.

Current Sensor Component

Next, a current sensor component 1 according to the first embodiment will be explained below. As shown in FIG. 1, the current sensor component 1 is configured by spiraling or looping the coil wire 2 around the conductor member 5.

Further, with respect to the first embodiment, a bobbin member having a cylindrical member in a cylindrical shape that is attached at the outer circumference of the conductor member 5 may be further provided. Thereafter, the coil wire 2 may also be wound around the outer circumference of the cylindrical member of the bobbin member.

Figure 7:
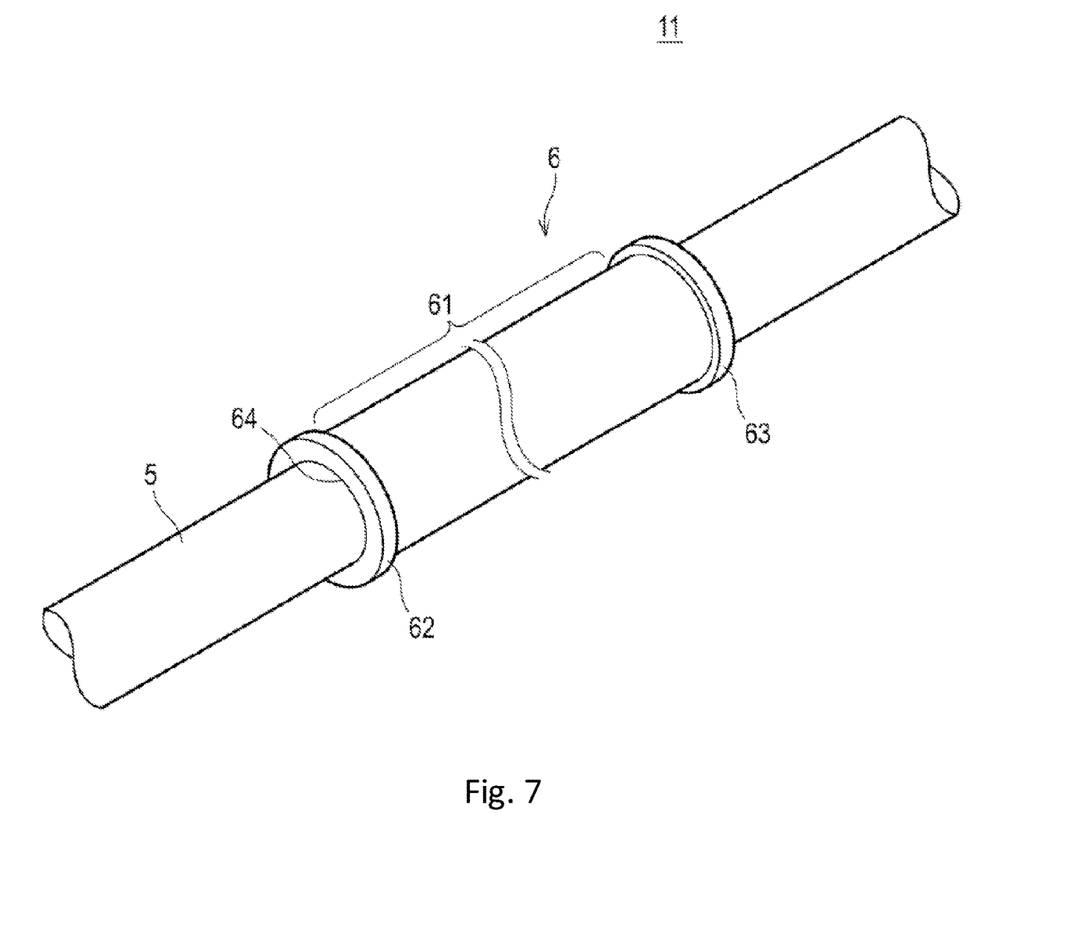
FIG. 7 is a schematic view for explaining a current sensor component that has a bobbin member according to the first embodiment of the present invention.

FIG. 7 is a diagram for explaining a current sensor component 11 that has a bobbin member 6. The bobbin member 6 is configured with a cylindrical member 61 and winding wire retaining parts 62 and 63 that are provided at both ends of the cylindrical member 61. The bobbin member 6 has an insertion through hole 64 so that the bobbin member 6 is attached to the conductor member 5 by inserting the conductor member 5 into the insertion through hole 64. With respect to the current sensor component 11, the coil wire 2 is arranged at a periphery of the conductor member 5 by being wound around the bobbin member 6.

A material of the bobbin member 6 is, for instance, an insulating resin. The winding wire retaining parts 62 and 63 are protrusion members that are formed on the cylindrical member 61. Further, the winding wire 22 is prevented from moving toward the outside from the cylindrical member 61 by passing over the winding wire retaining parts 62 and 63. Thus, the winding wire retaining parts 62 and 63 are flanges provided at the both ends of the cylindrical member 61. According to the first embodiment, a length between the winding wire retaining parts 62 and 63 is equal to the minimum length that a required length of the winding wire 22 can be wound. As a result, it becomes possible that the spirals "r" are mutually adhered in the entirety of the area in which the spirals "r" are supposed to be arranged.

With respect to the current sensor component 11 according to the first embodiment explained above, a piece of equipment (a member) that generates an electric current (measured current) and that is a measurement target is inserted into (the insertion through hole 64 of) the cylindrical member 61 of the bobbin member 6. Thereafter, a voltage is detected or a voltage value is measured in response to the changes of the measured electric current that flows in the measurement target.

Variation

Further, it is possible that the current sensor component 1 according to the first embodiment may not include the bobbin member 6. In this case, it is also possible that after the current sensor component 1 (the coil wire with extension (lead) wires) is directly wound around the outer circumference of the conductor member 5, the first extension wire 212 and the second extension wire 222 of the current sensor component 1 are attached to the external circuit 8 of a current sensor explained below. As a result, it is not necessary that the current sensor component 1 is re-attached after the conductor member 5 that has already been fixed is taken off. As compared with the conventional current sensor, the attachment convenience can be improved.

Current Sensor

Next, the current sensor 100 according to the first embodiment will be explained below. The current sensor 100 according to the first embodiment is configured with the coil wire 2 explained above and the external circuit 8 (the detector) that detects an electric signal. Specifically, the external circuit 8 is connected between the other end "p3" of the core wire 21 that configures the coil wire 2 and the other end "p4" of the conductive wire 220. The other end "p3" is different from one end "p1" of the core wire 21. The other end "p4" is different from one end "p2" of the conductive wire 220. The coil wire spiral 20 is formed by spiraling or looping the coil wire 2. The current sensor 100 detects an electric current "i" that flows through the coil wire spiral 20. The current sensor 100 according to the first embodiment explained above is shown in FIG. 2.

That is, as shown in FIG. 2, with respect to the current sensor 100, the one end "p1" of the core wire 21 and the one end "p2" of the winding wire 22 are connected to each other. The other end "p3" of the core wire 21 and the other end "p4" of the winding wire 22 are respectively connected to the first extension wire 212 and the second extension wire 222. Further, the external circuit 8 is connected to the first extension wire 212 and the second extension wire 222. The external circuit 8 works as the detector that detects an electric signal (a voltage).

With respect to the current sensor 100 according to the first embodiment, a voltage value or an electric field intensity that is generated at the coil wire 2 is changed according to the changes of an alternating or pulse electric current i that passes through the center of the coil wire spiral 20. The coil wire spiral 20 is formed by spiraling or looping the coil wire 2. The external circuit 8 detects the changes that are occurred in the coil wire 2 by the voltage between the first extension wire 212 and the second extension wire 222. Further, the external circuit 8 may also have an amplifier for amplifying the detection signal, a filter that eliminates a noise of the detection signal, and in addition, a display unit that displays a detection value of the detection signal.

Second Embodiment

Next, a current sensor component 31 according to a second embodiment of the present invention will be explained below.

Figure 8A:
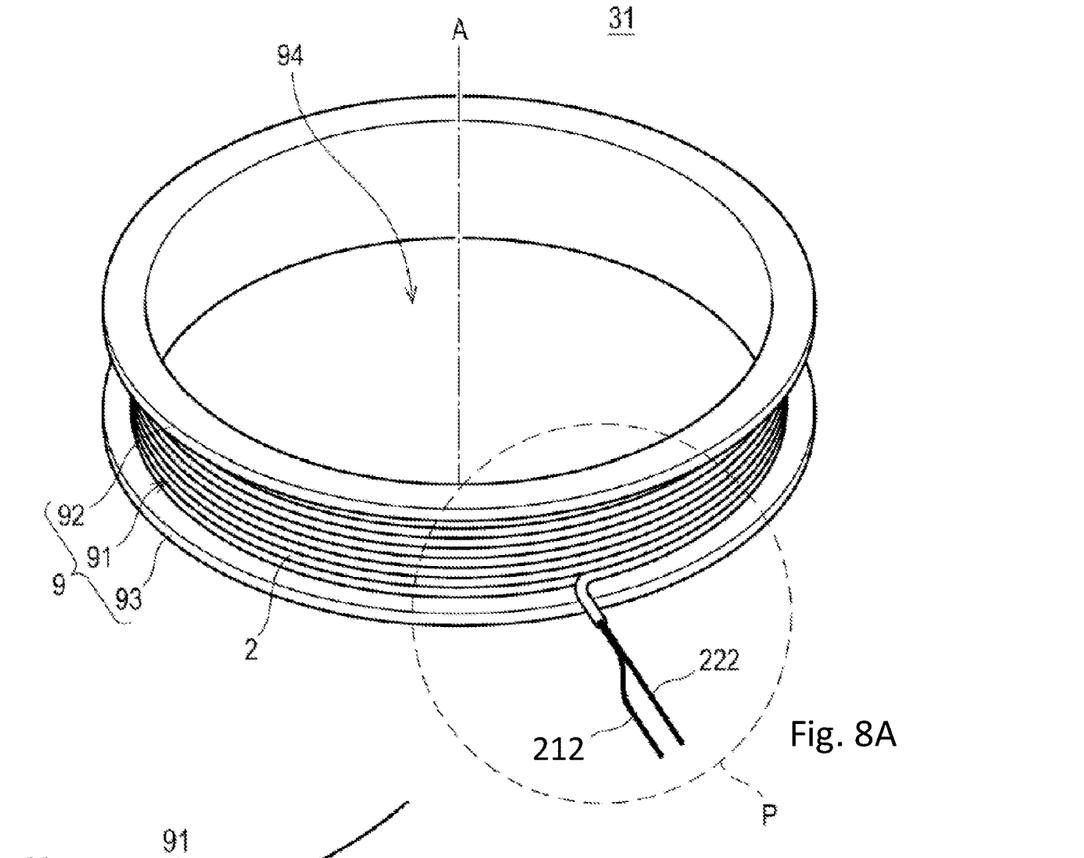
FIG. 8A is a schematic view that shows a state in which a coil wire is wound around a bobbin member according to the second embodiment of the present invention.
Figure 8B:
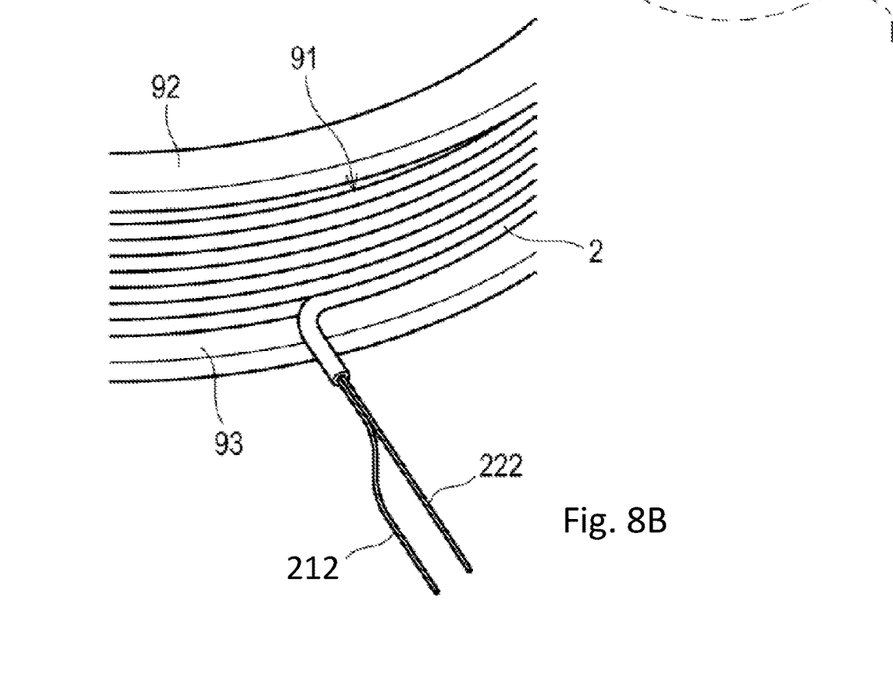
FIG. 8B is a partial enlarged view of FIG. 8A according to the second embodiment of the present invention.

FIGS. 8A and 8B are diagrams for explaining the current sensor component 31 according to the second embodiment. FIG. 8A is a schematic view for showing a state in which the coil wire 2 is wound around a bobbin member 9 according to the second embodiment. FIG. 8B is a partial enlarged view of the current sensor component 31 shown in FIG. 8A. The current sensor component 31 according to the second embodiment has the bobbin member 9 and the coil wire 2. Specifically, the bobbin member 9 has a cylindrical member 91 that is in a cylindrical shape. The coil wire 2 is wound around the bobbin member 9 a plurality of times. Specifically, the coil wire 2 is wound around a central axis "A" of the cylindrical member 91 of the bobbin member 9. In addition, the current sensor component 31 has the first extension wire 212 and the second extension wire 222. Specifically, the first extension wire 212 and the second extension wire 222 are connected to the end "p3" of the core wire 21 that configures the coil wire 2 and the end "p4" of the conductive wire 220, respectively. Further, an upper flange part 92 and a lower flange part 93 are formed at the top and bottom of the cylindrical member 91. Specifically, the upper flange part 92 and the lower flange part 93 outwardly project from the cylindrical member 91 in a radial direction. Further, an insertion through hole (hollow part) 94 that vertically penetrates the cylindrical member 91 is provided at the center of the cylindrical member 91. Further, a length in the vertical direction of the cylindrical member 91 is much smaller than a diameter of the coil wire spiral 20. Further, at this time, an inner circumferential surface of the cylindrical member 91 may not adhere to an outer circumferential surface of the conductor member 5. As a result, even when an installation area is small or there is a restriction for the installation, a current sensor according to the second embodiment can be installed.

The bobbin member 9 according to the second embodiment has the cylindrical member 91 in the same manner as the bobbin member 6 (FIG. 7). However, the bobbin member 9 is different from the bobbin member 6 because the cylindrical member 91 is not used for inserting the conductor member 5. The cylindrical member 91 of the bobbin member 9 is in the cylindrical shape so that a cross section of the bobbin member 9 along a direction orthogonal to the central axis "A" of the cylindrical member 91 has a circular cross section. Further, the second embodiment is not limited to the above configuration in which the cylindrical member 91 is in the cylindrical shape. The cross section may also be in an elliptical shape, a rectangular shape, or a polygonal shape.

With respect to the current sensor component 31 according to the second embodiment explained above, a piece of equipment (a member) that generates an electric current (measured current) and that is a measurement target is inserted into the insertion through hole 94 of the cylindrical member 91 of the bobbin member 9. Thereafter, a voltage is detected or a voltage value is measured in response to the changes of the electric current that flows in the measurement target. When the current sensor component 31 is assembled as a component of the equipment, it is preferred that the shape of the cylindrical member 91 and the size of the insertion through hole 94 are designed accordingly to fit to an installation position of the equipment.

Further, it is further preferred that the current sensor component 31 has an opening and closing member with which the portion of the cylindrical member 91 can be opened and closed. Thus, for instance, when one attempts to attach the current sensor component 31 to the measurement target that is already fixed, first of all, the opening and closing member is opened. Thereafter, the equipment of the measurement target is inserted into an inside of the insertion through hole 94 in the cylindrical member 91 and the opening and closing member is closed. As a result, the current sensor component 31 is easily attached to the equipment of the measurement target.

According to the present embodiments explained above, since the core wire 21 and the inner circumferential surface "S" of the winding wire 22 are directly adjacent to (next to) each other with a short distance therebetween or come in contact with each other, the number of turns of the winding wire 22 per unit length can be increased. Further, the cross section of the coil wire 2 can be reduced so that the coil can be thinned (have a narrower wire). As a result, the current sensor 100 that is configured by spiraling or looping the coil wire 2 can be made compact. Further, according to the present embodiments, since the number of turns of the coil wire 2 is increased, the inductance of the coil can be increased without utilizing a magnetic (substance) core. As a result, according to the present embodiments, it is possible to provide a current sensor, in which a small number of components are used, a size and a weight are small, and the installation is convenient.

Further, according to the present embodiments, the dispersion of the diameters of the winding wire 22 is suppressed because the winding wire 22 is wound around the core wire 21 while the winding wire 22 comes in contact with the core wire 21. As a result, the dispersion of the characteristics of the current sensor 100 that is configured by using the coil wire 2 can also be decreased. As a result, according to the present embodiments, it is possible to provide a current sensor that has a higher manufacturing yield and a higher reliability.

The coil wire, the current sensor component, and the current sensor being thus described, it will be apparent that the same may be varied in many ways. Such variations are not to be regarded as a departure from the spirit and scope of the invention, and all such modifications as would be apparent to one of ordinary skill in the art are intended to be included within the scope of the following claims. Further, the above embodiments can be combined with each other and such combinations are not to be regarded as a departure from the spirit and scope of the invention.

The embodiments explained above include the following technical ideas:

(1) A coil wire including: a core wire having flexibility and conductivity; and a winding wire configured with a conductive wire and a first insulating film that coats the conductive wire. One end of the core wire is electrically connected to one end of the winding wire. The winding wire is wound around a circumference of the core wire so as to form a plurality of spirals. The core wire is a common central axis of the plurality of spirals. The coil wire satisfies one of conditions (i) or (ii):

(i) an outer surface of the core wire is exposed, and a shortest distance between the outer surface of the core wire and an inner circumferential surface of at least part of the plurality of spirals of the winding wire is smaller than a thickness of the first insulating film; or (ii) the outer surface of the core wire is coated by a second insulating film, and a shortest distance between an outer surface of the second insulating film and the inner circumferential surface of at least part of the plurality of spirals of the winding wire is smaller than a thickness of a thicker one of the first insulating film and the second insulating film.

(2) In the coil wire according to (1), when the outer surface of the core wire is exposed, at least part of the inner circumferential surface of at least part of the plurality of spirals of the winding wire contacts the outer surface of the core wire. When the second insulating film coats the outer surface of the core wire, at least part of the inner circumferential surface of at least part of the plurality of spirals of the winding wire contacts the outer surface of the second insulating film.

(3) In the coil wire according to (1) or (2), when the outer surface of the core wire is exposed, the inner circumferential surface of at least part of the plurality of spirals of the winding wire contacts an entirety of a perimeter of the outer surface of the core wire. When the second insulating film coats the outer surface of the core wire, the inner circumferential surface of at least part of the plurality of spirals of the winding wire contacts an entirety of a perimeter of the outer surface of the second insulating film.

(4) In the coil wire according to one of (1)-(3), two adjacent conductive wires forming two adjacent spirals of the plurality of spirals directly contact each other at a certain part of the winding wire.

(5) A current sensor component including: a bobbin having a cylindrical member; the coil wire according to one of (1)-(4), the coil wire is wound around a center axis of the cylindrical member of the bobbin several times; a first lead wire connected to one end of the core wire and one end of the winding wire; and a second lead wire connected to the other end of the core wire and the other end of the winding wire.

(6) A current sensor component including: a longitudinal (elongated) conductor member having terminals at both ends; and the coil wire according to one of (1)-(4) that is wound around the conductor member.

(7) The current sensor component according to (6) further includes a bobbin having a cylindrical member that is assembled to an outer circumference of the elongated conductor member. The coil wire is wound around the cylindrical member of the bobbin.

(8) A current sensor including: the coil wire according to one of (1)-(4); and a detector connected between one end of the core wire and one end of the winding wire so as to detect an electric signal. The detector is configured to detect the electric signal corresponding to an electric current flowing through a coil wire spiral. The coil wire spiral is formed by spiraling or looping the coil wire.

What is claimed is:

1. A coil wire comprising:
   a core wire having flexibility and conductivity; and
   a winding wire configured with a conductive wire and a first insulating film that entirely coats the conductive wire,
   wherein a first end of the core wire is electrically connected to a first end of the winding wire, the winding wire is wound around a circumference of the core wire so as to form a plurality of spirals, and the core wire is a common central axis of the plurality of spirals,
   the coil wire satisfies one of a condition (i) or a condition (ii):
   (i) an outer surface of the core wire is exposed, and a shortest distance between the outer surface of the core wire and an inner circumferential surface of at least part of the plurality of spirals of the winding wire is smaller than a thickness of the first insulating film; or
   (ii) the outer surface of the core wire is coated by a second insulating film, and a shortest distance between an outer surface of the second insulating film and the inner circumferential surface of at least part of the plurality of spirals of the winding wire is smaller than a thickness of a thicker one of the first insulating film and the second insulating film,
   two adjacent conductive wired form two adjacent spirals of the plurality of spirals, and
   outer surfaces of the first insulating films located between the two adjacent conductive wires of the two adjacent spirals directly contact each other at part of the winding wire.

2. The coil wire according to claim 1,
   wherein, when the outer surface of the core wire is exposed, at least part of the inner circumferential surface of at least part of the plurality of spirals of the winding wire contacts the outer surface of the core wire, and
   when the second insulating film coats the outer surface of the core wire, at least part of the inner circumferential surface of at least part of the plurality of spirals of the winding wire contacts the outer surface of the second insulating film.

3. The coil wire according to claim 1,
   wherein, when the outer surface of the core wire is exposed, the inner circumferential surface of at least part of the plurality of spirals of the winding wire contacts an entirety of a perimeter of the outer surface of the core wire, and
   when the second insulating film coats the outer surface of the core wire, the inner circumferential surface of at least part of the plurality of spirals of the winding wire contacts an entirety of a perimeter of the outer surface of the second insulating film.

4. A current sensor component comprising:
   a bobbin having a cylindrical member,
   a coil wire, the coil wire being wound around a center axis of the cylindrical member of the bobbin several times, the coil wire having:
      a core wire having flexibility and conductivity; and
      a winding wire configured with a conductive wire and a first insulating film that coats the conductive wire;
   a first lead wire connected to a first end of the core wire and a first end of the winding wire; and
   a second lead wire connected to a second end of the core wire and a second end of the winding wire,
   wherein the winding wire is wound around a circumference of the core wire so as to form a plurality of spirals, and the core wire is a common central axis of the plurality of spirals, and
   the coil wire satisfies one of a condition (i) or a condition (ii):
   (i) an outer surface of the core wire is exposed, and a shortest distance between the outer surface of the core wire and an inner circumferential surface of at least part of the plurality of spirals of the winding wire is smaller than a thickness of the first insulating film; or
   (ii) the outer surface of the core wire is coated by a second insulating film, and a shortest distance between an outer surface of the second insulating film and the inner circumferential surface of at least part of the plurality of spirals of the winding wire is smaller than a thickness of a thicker one of the first insulating film and the second insulating film.

5. The current sensor component according to claim 4,
   wherein, when the outer surface of the core wire is exposed, at least part of the inner circumferential surface of at least part of the plurality of spirals of the winding wire contacts the outer surface of the core wire, and
   when the second insulating film coats the outer surface of the core wire, at least part of the inner circumferential surface of at least part of the plurality of spirals of the winding wire contacts the outer surface of the second insulating film.

6. The current sensor component according to claim 4,
   wherein, when the outer surface of the core wire is exposed, the inner circumferential surface of at least part of the plurality of spirals of the winding wire contacts an entirety of a perimeter of the outer surface of the core wire, and
   when the second insulating film coats the outer surface of the core wire, the inner circumferential surface of at least part of the plurality of spirals of the winding wire contacts an entirety of a perimeter of the outer surface of the second insulating film.

7. The current sensor component according to claim 4,
   wherein two adjacent conductive wires form two adjacent spirals of the plurality of spirals, and
   outer surfaces of the first insulating films located between the two adjacent conductive wires of the two adjacent spirals directly contact each other at part of the winding wire.

8. A current sensor component comprising:
   an elongated conductor member having terminals at both ends; and
   a coil wire wound around the conductor member, the coil wire having:
      a core wire having flexibility and conductivity; and
      a winding wire configured with a conductive wire and a first insulating film that entirely coats the conductive wire,
   wherein a first end of the core wire is electrically connected to a first end of the winding wire, the winding wire is wound around a circumference of the core wire so as to form a plurality of spirals, and the core wire is a common central axis of the plurality of spirals,
   the coil wire satisfies one of a condition (i) or a condition (ii):

(i) an outer surface of the core wire is exposed, and a shortest distance between the outer surface of the core wire and an inner circumferential surface of at least part of the plurality of spirals of the winding wire is smaller than a thickness of the first insulating film; or (ii) the outer surface of the core wire is coated by a second insulating film, and a shortest distance between an outer surface of the second insulating film and the inner circumferential surface of at least part of the plurality of spirals of the winding wire is smaller than a thickness of a thicker one of the first insulating film and the second insulating film, two adjacent conductive wire form two adjacent spirals of the plurality of spirals, and outer surfaces of the first insulating films located between the two adjacent conductive wires of the two adjacent spirals directly contact each other at part of the winding wire.

9. The current sensor component according to claim 8, further comprising:

a bobbin having a cylindrical member that is assembled to an outer circumference of the elongated conductor member, wherein the coil wire is wound around the cylindrical member of the bobbin.

10. The current sensor component according to claim 8, wherein, when the outer surface of the core wire is exposed, at least part of the inner circumferential surface of at least part of the plurality of spirals of the winding wire contacts the outer surface of the core wire, and when the second insulating film coats the outer surface of the core wire, at least part of the inner circumferential surface of at least part of the plurality of spirals of the winding wire contacts the outer surface of the second insulating film.

11. The current sensor component according to claim 8, wherein, when the outer surface of the core wire is exposed, the inner circumferential surface of at least part of the plurality of spirals of the winding wire contacts an entirety of a perimeter of the outer surface of the core wire, and when the second insulating film coats the outer surface of the core wire, the inner circumferential surface of at least part of the plurality of spirals of the winding wire contacts an entirety of a perimeter of the outer surface of the second insulating film.

12. A current sensor comprising:

a coil wire, the coil wire having:
  a core wire having flexibility and conductivity; and
  a winding wire configured with a conductive wire and a first insulating film that entirely coats the conductive wire; and a detector connected between a first end of the core wire and a first end of the winding wire so as to detect an electric signal, wherein a second end of the core wire is electrically connected to a second end of the winding wire, the winding wire is wound around a circumference of the core wire so as to form a plurality of spirals, and the core wire is a common central axis of the plurality of spirals, the coil wire satisfies one of a condition (i) or a condition (ii):

(i) an outer surface of the core wire is exposed, and a shortest distance between the outer surface of the core wire and an inner circumferential surface of at least part of the plurality of spirals of the winding wire is smaller than a thickness of the first insulating film; or (ii) the outer surface of the core wire is coated by a second insulating film, and a shortest distance between an outer surface of the second insulating film and the inner circumferential surface of at least part of the plurality of spirals of the winding wire is smaller than a thickness of a thicker one of the first insulating film and the second insulating film, the detector is configured to detect the electric signal corresponding to an electric current flowing through a coil wire spiral, and the coil wire spiral is formed by spiraling the coil wire, two adjacent conductive wires form two adjacnet spirals of the plurality of spirals, and outer surfaces of the first insulating films located between the two adjacent conductive wires of the two adjacent spirals directly contact each other at part of the winding wire.

13. The current sensor according to claim 12, wherein, when the outer surface of the core wire is exposed, at least part of the inner circumferential surface of at least part of the plurality of spirals of the winding wire contacts the outer surface of the core wire, and when the second insulating film coats the outer surface of the core wire, at least part of the inner circumferential surface of at least part of the plurality of spirals of the winding wire contacts the outer surface of the second insulating film.

14. The current sensor according to claim 12, wherein, when the outer surface of the core wire is exposed, the inner circumferential surface of at least part of the plurality of spirals of the winding wire contacts an entirety of a perimeter of the outer surface of the core wire, and when the second insulating film coats the outer surface of the core wire, the inner circumferential surface of at least part of the plurality of spirals of the winding wire contacts an entirety of a perimeter of the outer surface of the second insulating film.

* * * * *